US006843421B2

(12) United States Patent
Chhor et al.

(10) Patent No.: US 6,843,421 B2
(45) Date of Patent: Jan. 18, 2005

(54) MOLDED MEMORY MODULE AND METHOD OF MAKING THE MODULE ABSENT A SUBSTRATE SUPPORT

(75) Inventors: Khushrav S. Chhor, Fremont, CA (US); Larry L. Moresco, Eagle, ID (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 349 days.

(21) Appl. No.: 09/928,767

(22) Filed: Aug. 13, 2001

(65) Prior Publication Data

US 2003/0029920 A1 Feb. 13, 2003

(51) Int. Cl.[7] .............................................. G06K 19/06
(52) U.S. Cl. ...................... 235/492; 257/679; 257/777; 174/52.4
(58) Field of Search ................................ 235/492, 441; 902/25, 26, 29; 361/737; 257/679, 433, 777, 686, 676; 174/52.4

(56) References Cited

U.S. PATENT DOCUMENTS

| 3,414,892 | A | 12/1968 | McCormack et al. |
| 3,432,827 | A | 3/1969 | Sarno |
| 4,489,478 | A | 12/1984 | Sakurai |
| 4,500,905 | A | 2/1985 | Shibata |
| 4,535,424 | A | 8/1985 | Reid |
| 4,630,096 | A | 12/1986 | Drye et al. |

(List continued on next page.)

FOREIGN PATENT DOCUMENTS

| EP | 0 073 486 | 3/1983 |
| EP | 0 387 834 | 9/1990 |
| EP | 0 395 886 | 11/1990 |
| EP | 0 516 866 | 12/1992 |
| EP | 0 606 653 | 7/1994 |
| EP | 0 644 548 | 3/1995 |
| EP | 0 800 137 | 10/1997 |
| JP | 60-22352 | 2/1985 |
| JP | 61-222216 | 10/1986 |
| JP | 63-52463 | 3/1988 |
| JP | 2-177553 A | * 7/1990 |
| JP | 2000-194818 A | * 7/2000 |
| WO | 94/26083 | 11/1994 |

OTHER PUBLICATIONS

Dipert, "Exotic memories, diverse approaches," EDN Asia, Sep. 2001, pp. 22–33.
Akasaka, "Three–dimensional integrated circuit: technology and application prospect," Microelectronics Journal, vol. 20, Nos. 1–2, 1989, pp. 105–112, no month.
Sakamoto, "Architecture des Circuits à Trois Dimensions," Bulletin of the Electrotechnical Laboratory, vol. 51, No. 1, 1987, pp. 16–29, no month.

(List continued on next page.)

*Primary Examiner*—Jared J. Fureman
(74) *Attorney, Agent, or Firm*—Kevin J. Daffer; Daffer McDaniel, LLP

(57) ABSTRACT

An improved memory module and method of manufacture are presented. The memory module takes on the same outer dimensions as conventional memory cards. The memory module includes an integrated circuit and a conductor encased within molded resin. The conductor can be taken from a tape or a lead frame, and can include bumps or wires extending from the conductor to corresponding bonding pads on the integrated circuit. The bonded integrated circuit can thereafter be placed within a cavity formed inside a mold housing, where resin may be injected to form the memory module. The conductor can also be shaped so as to extend on multiple planes from the connection point on or near the bonding pad to an edge connector residing near one edge only of the memory module. The conductor is thereby connected to the integrated circuit and provides slide-in, releasable coupling to a receptor.

20 Claims, 5 Drawing Sheets

U.S. PATENT DOCUMENTS

| | | | |
|---|---|---|---|
| 4,672,577 A | | 6/1987 | Hirose et al. |
| 4,710,798 A | | 12/1987 | Marcantonio |
| 4,811,082 A | | 3/1989 | Jacobs et al. |
| 4,894,707 A | * | 1/1990 | Yamawaki et al. ......... 257/680 |
| 5,001,539 A | | 3/1991 | Inoue et al. |
| 5,012,323 A | * | 4/1991 | Farnworth .................. 257/676 |
| 5,089,862 A | | 2/1992 | Warner, Jr. et al. |
| 5,160,987 A | | 11/1992 | Pricer et al. |
| 5,172,214 A | * | 12/1992 | Casto ........................ 257/676 |
| 5,191,405 A | | 3/1993 | Tomita et al. |
| 5,202,754 A | | 4/1993 | Bertin et al. |
| 5,227,338 A | | 7/1993 | Kryzaniwsky |
| 5,266,912 A | | 11/1993 | Kledzik |
| 5,283,468 A | | 2/1994 | Kondo et al. |
| 5,398,200 A | | 3/1995 | Mazuré et al. |
| 5,422,435 A | * | 6/1995 | Takiar et al. .............. 174/52.4 |
| 5,426,566 A | | 6/1995 | Beilstein, Jr. et al. |
| 5,434,745 A | | 7/1995 | Shokrgozar et al. |
| 5,453,952 A | | 9/1995 | Okudaira et al. |
| 5,455,445 A | | 10/1995 | Kurtz et al. |
| 5,468,997 A | | 11/1995 | Imai et al. |
| 5,481,090 A | | 1/1996 | Senock et al. |
| 5,481,133 A | | 1/1996 | Hsu |
| 5,495,398 A | | 2/1996 | Takiar et al. |
| 5,502,289 A | | 3/1996 | Takiar et al. |
| 5,523,608 A | * | 6/1996 | Kitaoka et al. ............. 257/433 |
| 5,523,622 A | | 6/1996 | Harada et al. |
| 5,523,628 A | | 6/1996 | Williams et al. |
| 5,552,963 A | | 9/1996 | Burns |
| 5,561,622 A | | 10/1996 | Bertin et al. |
| 5,581,498 A | | 12/1996 | Ludwig et al. |
| 5,585,675 A | | 12/1996 | Knopf |
| 5,612,570 A | | 3/1997 | Eide et al. |
| 5,654,220 A | | 8/1997 | Leedy |
| 5,693,552 A | | 12/1997 | Hsu |
| 5,696,031 A | | 12/1997 | Wark |
| 5,702,985 A | | 12/1997 | Burns |
| 5,703,747 A | | 12/1997 | Voldman et al. |
| 5,745,407 A | | 4/1998 | Levy et al. |
| 5,780,925 A | | 7/1998 | Cipolla et al. |
| 5,781,031 A | | 7/1998 | Bertin et al. |
| 5,796,164 A | | 8/1998 | McGraw et al. |
| 5,801,437 A | | 9/1998 | Burns |
| 5,886,408 A | * | 3/1999 | Ohki et al. .................. 257/720 |
| 5,915,167 A | | 6/1999 | Leedy |
| 5,969,380 A | | 10/1999 | Seyyedy |
| 5,973,951 A | | 10/1999 | Bechtolsheim et al. |
| 5,976,953 A | | 11/1999 | Zavracky et al. |
| 5,985,693 A | | 11/1999 | Leedy |
| 6,057,598 A | | 5/2000 | Payne et al. |
| 6,072,234 A | | 6/2000 | Camien et al. |
| 6,085,412 A | | 7/2000 | Iwasaki |
| 6,087,722 A | | 7/2000 | Lee et al. |
| 6,108,730 A | | 8/2000 | Dell et al. |
| 6,133,640 A | | 10/2000 | Leedy |
| 6,143,590 A | * | 11/2000 | Ohki et al. .................. 438/122 |
| 6,185,122 B1 | | 2/2001 | Johnson et al. |
| 6,197,641 B1 | | 3/2001 | Hergenrother et al. |
| 6,208,545 B1 | | 3/2001 | Leedy |
| 6,252,791 B1 | | 6/2001 | Wallace et al. |
| 6,274,926 B1 | * | 8/2001 | Iwasaki ..................... 257/679 |
| 6,281,042 B1 | | 8/2001 | Ahn et al. |
| 6,291,858 B1 | | 9/2001 | Ma et al. |
| 6,297,547 B1 | * | 10/2001 | Akram ....................... 257/676 |
| 6,307,257 B1 | | 10/2001 | Huang et al. |
| 6,314,013 B1 | | 11/2001 | Ahn et al. |
| 6,316,727 B1 | * | 11/2001 | Liu ............................ 174/52.4 |
| 6,322,903 B1 | | 11/2001 | Siniaguine et al. |
| 6,337,521 B1 | | 1/2002 | Masuda |
| 6,351,028 B1 | | 2/2002 | Akram |
| 6,353,265 B1 | | 3/2002 | Michii |
| 6,355,501 B1 | | 3/2002 | Fung et al. |
| 6,367,017 B1 | * | 4/2002 | Gray .......................... 713/200 |
| 6,414,385 B1 | * | 7/2002 | Huang et al. ............... 257/777 |
| 6,431,456 B2 | * | 8/2002 | Nishizawa et al. ......... 235/492 |
| 6,515,359 B1 | | 2/2003 | Corisis et al. |
| 6,531,773 B2 | | 3/2003 | Nishizawa et al. |
| 6,583,512 B2 | * | 6/2003 | Nakaoka et al. ............ 257/777 |
| 6,664,616 B2 | * | 12/2003 | Tsubosaki et al. .......... 257/679 |
| 6,704,204 B1 | * | 3/2004 | Eskildsen et al. ........... 361/737 |
| 6,731,011 B2 | * | 5/2004 | Verma et al. ............... 257/777 |
| 6,733,954 B2 | * | 5/2004 | Yamamoto et al. ......... 430/311 |
| 2001/0033030 A1 | | 10/2001 | Leedy |
| 2001/0054759 A1 | | 12/2001 | Nishiura |
| 2002/0024146 A1 | | 2/2002 | Furusawa |
| 2002/0027275 A1 | | 3/2002 | Fujimoto et al. |
| 2002/0030262 A1 | | 3/2002 | Akram |
| 2002/0030263 A1 | | 3/2002 | Akram |
| 2003/0071348 A1 | * | 4/2003 | Eguchi et al. .............. 257/723 |
| 2003/0189236 A1 | * | 10/2003 | Arndt ......................... 257/433 |
| 2004/0066693 A1 | * | 4/2004 | Osako et al. ............... 365/222 |
| 2004/0084741 A1 | * | 5/2004 | Boon et al. ................. 257/433 |
| 2004/0169285 A1 | * | 9/2004 | Verma et al. ............... 257/777 |
| 2004/0178490 A1 | * | 9/2004 | Abe et al. ................... 257/686 |
| 2004/0183206 A1 | * | 9/2004 | Wehrly, Jr. .................. 257/777 |

OTHER PUBLICATIONS

Akasaka, "Three–Dimensional IC Trends," Proceedings of the IEEE, vol. 74, No. 12, Dec. 1986, pp. 1703–1714.

Pein et al., "Performance of the 3–D PENCIL Flash EPROM Cell and Memory Array," IEEE Transactions on Electron Devices, vol. 42, No. 11, Nov. 1995, pp. 1982–1991.

Jokerst et al., "Manufacturable Multi–Material Integration: Compound Semiconductor Devices Bonded to Silicon Circuitry," SPIE vol. 2524, 1995, pp. 152–163, no month.

Camperi–Ginestet et al., "Vertical Electrical Interconnection of Compound Semiconductor Thin–Film Devices to Underlying Silicon Circuitry," IEEE Photonics Technology Letters, vol. 4, No. 9, Sep. 1992, pp. 1003–1006.

Lomatch et al., "Multilayered Josephson junction logic and memory devices," SPIE vol. 2157, Jan. 1994, Abstract Only, 2 pgs.

Lu, "Advanced cell structures for dynamic RAMs," IEEE Circuits and Devices, vol. 5, No. 1, Jan. 1989, Abstract Only, 2 pgs.

Sakamoto, "Architecture of three dimensional devices," Bulletin of the Electrotechnical Laboratory, vol. 51, No. 1, 1987, Abstract Only, 2 pgs, no month.

"Wide application of low–cost associative processing seen," Electronic Engineering Times, Aug. 1996, 6 pgs.

"Interconnects & Packaging," Electronic Engineering Times, Jun. 1996, 8 pgs.

"Closing in on gigabit DRAMs," Electronic Engineering Times, Nov. 1995, 4 pgs.

"Module Pact Pairs Cubic Memory with VisionTek," Semiconductor Industry & Business Survey, vol. 17, No. 15, Oct. 1995, 2 pgs.

Flaherty, "Layers of BST materials push toward 1Gbit DRAM," Electronic Times, Oct. 1995, 3 pgs.

Santoni, "Technologies Will Pursue Higher DRAM Densities," Electronic News, 7 pgs., Dec. 1994.

Weber, "Looking for diverse storage," Electronic Engineering Times, Oct. 1994, 7 pgs.

"Special Report: Memory Market Startups, Cubic Memory: 3D Space Savers," Semiconductor Industry & Business Survey, vol. 16, No. 13, Sep. 1994, 6 pgs.

Bindra, "Technique boosts 3D memory density," Electronic Engineering Times, Aug. 1994, 2 pgs.

Bindra, "Memory packs poised for 3–D use," Electronic Engineering Times, Dec. 1992, 4 pgs.

Derman, "MCMs hit the road," Electronic Engineering Times, Jun. 1992, 6 pgs.

Bindra, "IEDM ponders the 'gigachip' era," Electronic Engineering Times, Jan. 1992, 4 pgs.

"Tech Watch: 1–Gbit DRAM in sight," Electronic World News, Dec. 1991, 2 pgs.

Derman, "MCMs meld into systems," Electronic Engineering Times, Jul. 1991, 7 pgs.

Brown, "Systems EEs see future in 3–D," Electronic Engineering Times, Sep. 1990, 4 pgs.

Hayashi et al., "A New Three Dimensional IC Fabrication Technology, Stacking Thin Film Dual CMOS Layers," © 1991 IEEE, 4 pgs, no month.

Tielert, "Benefits of Vertically Stacked Integrated Circuits for Sequential Logic," © 1996 IEEE, pp. 121–124, no month.

Stern et al., "Design and Evaluation of an Epoxy Three–Dimensional Multichip Module," IEEE Transactions on Components, Packaging, and Manufacturing Technology—Part B, vol. 19, No. 1, 1996, pp. 188–194, no month.

Bertin et al., "Evaluation of a Three–Dimensional Memory Cube System," IEEE Transactions on Components, Hybrids, and Manufacturing Technology, vol. 16, No. 8, 1993, pp. 1006–1011, no month.

Watanabe et al., "Stacked Capacitor Cells for High–density dynamic RAMs," © 1988 IEEE, pp. 600–604, no month.

"Stacked Memory Modules," IBM Technical Disclosure Bulletin, vol. 38, No. 5, May 1995, 2 pgs.

"3–D Chip–on–chip Stacking," Semiconductor International, Dec. 1991, 1 pg.

Thakur et al., "An Optimal Layer Assignment Algorithm for Minimizing Crosstalk for Three Layer VHV Channel Routing," © 1995 IEEE, pp. 207–210, no month.

Terrill et al., "3D Packaging Technology Overview and Mass Memory Applications," © 1996 IEEE, pp. 347–355, no month.

Sugahara et al., "A Three–Dimensional Static RAM," IEEE Electron Device Letters, vol. EDL7, No. 5, May 1986, pp. 327–329.

Tielert, "Benefits of Vertically Stacked Integrated Circuits for Sequential Logic," © Dec. 1996 IEEE, pp. 121–124.

Akasaka, "Three–Dimensional IC Trends," © 1986 IEEE, pp. 1703–1714, no month.

Kurokawa et al., "3–D VLSI Technology in Japan and an Example: a Syndrome Decoder for Double Error Correction," Future Generation Computer Systems, vol. 4, No. 2, Sep. 1988, pp. 145–155.

Maliniak, "Memory–Chip Stacks Send Density Skyward," Electronic Design, vol. 42, No. 17, Aug. 1994, 5 pgs.

Schlaeppi et al., "Submicrosecond Core Memories Using Multiple Coincidence," IRE Transactions on Electronic Computers, Jun. 1960, pp. 192–198.

Schlaeppi et al., "Submicrosecond Core Memories Using Multiple Coincidence," Feb. 1960 International Solid State Circuits Conference, pp. 54–55.

Lay, "TRW Develops Wireless Multiboard Interconnect System," Electronic Engineering Times, Nov. 1984, 1 pg.

Yamazaki et al., "Fabrication Technologies for Dual 4–Kbit Stacked SRAM," © 1986 IEEE, pp. 435–438, no month.

* cited by examiner

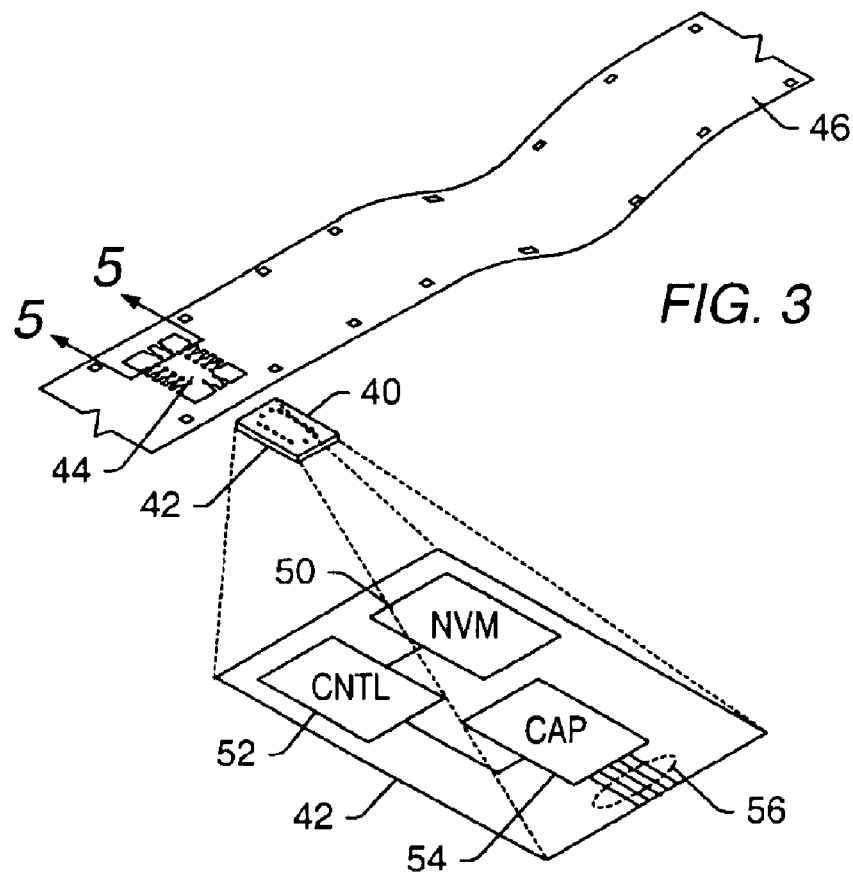
FIG. 3
FIG. 4
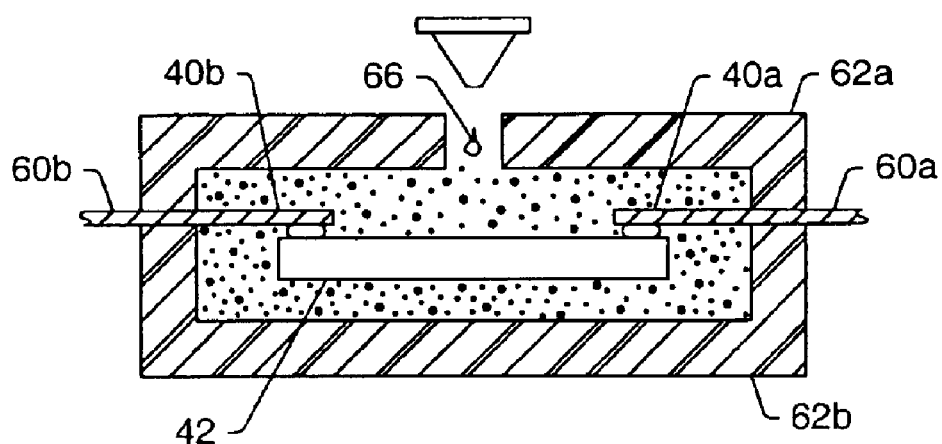
FIG. 5

MOLDED MEMORY MODULE AND METHOD OF MAKING THE MODULE ABSENT A SUBSTRATE SUPPORT

BACKGROUND OF THE INVENTION

1. Field of the Invention

This invention relates to integrated circuit packaging and, more particularly, to semiconductor memory encased within a molded resin to form a memory module having edge connectors aligned substantially within a row near the edge of the module. The edge connectors are configured as substantially planar pads extending along an outer surface of the module, where the outer, exposed surface of the edge connectors frictionally contact against an outer surface of corresponding pads arranged within a receptor. The receptor thereby receives the memory module dimensioned according to standards adopted by compact flash card, smart media card, flash path card, multimedia card and secure digital card manufacturers, including the standardized dimensions offered by JEIDA and PCMCIA, for example.

2. Description of the Related Art

The following descriptions and examples are not admitted to be prior art by virtue of their inclusion within this section.

An electronic system is typically known as any device that can receive, transmit, and process electronic signals. Examples of popular electronic systems include the personal computer, personal digital assistant (PDA), digital camera, or any other electronic-based appliance used in a consumer setting. A commonality among all electronic systems is that they employ an interconnection of one or more circuits. Depending on the amount of integration, the circuits can be formed on a single monolithic substrate, often a silicon substrate, henceforth referred to as an integrated circuit.

Typical electronic systems use one or more integrated circuits connected to each other by conductors. Thus, circuits within one integrated circuit can communicate with circuits within another integrated circuit. In order to protect the functionality of the circuits, each integrated circuit is often placed in a package which seals the integrated circuit from the environment. In addition to it being used to protect an integrated circuit, a package can also help distribute signals sent to and from the integrated circuit and, depending on the materials used, the package may also help dissipate heat that occurs during operation of the integrated circuit.

There are numerous types of integrated circuit packages, basically categorized as either ceramic packages or plastic packages. Ceramic packages surround the encased integrated circuit with air, while plastic packages generally employ a resin that fills the space between the integrated circuit and the surrounding package. Plastic packages are often less expensive than ceramic packages. Regardless of whether ceramic or plastic is used, there are numerous package configurations and lead arrangements extending from the package. The leads serve to communicate signals to and from the integrated circuit and, thus, are electrically connected to corresponding bonding pads on the integrated circuit in one of possibly three ways: wire bonds, Tape-Automated Bonding (TAB), or flip-chip. Each of these arrangements are relatively well-known and are used in differing applications based on cost constraints and the density of the integrated circuit bonding pads.

Once the integrated circuit is bonded to the leads and a package is formed about the integrated circuit, the matter of connecting one packaged integrated circuit to another packaged integrated circuit generally involves a printed circuit board or "card." A card is a rigid, substantially planar backbone element that employs one or more layers of trace conductors separated by a dielectric. The trace conductors extend along one ore more of the conductive layers and, through vias, connect leads of one integrated circuit to leads of another integrated circuit. The printed circuit board can have plated-through holes to accommodate downward extending leads of a packaged integrated circuit, or can simply have a square or rectangular pad on which planar surfaces of the packaged integrated circuit leads can be surface-mounted. The card serves not only to interconnect signals between integrated circuits, but also provides mechanical support for multiple integrated circuits arranged within a chassis of the electronic system. The card thereby suffices to arrange the bonded integrated circuits a spaced distance from each other within the confines of the chassis.

There are numerous ways in which to configure a card and the integrated circuits bonded to that card. For example, FIGS. 1 and 2 illustrate a memory card 10 with edge connectors 12. Edge connectors 12 can be arranged on the backside surface of card 10 near a forward-leading edge 14 of card 10. According to this example, edge 14 can be inserted through a slot 16 extending through a chassis 18 of an electronic system 20.

Memory card 10 can, therefore, be inserted into a receptor 22 that is electrically connected to, for example, another card 24. Like card 10, card 24 may also contain printed conductors and one or more integrated circuits 26 interconnected with each other on a surface of card 24. However, distinguishable from card 24, card 10 is used for a specific purpose that can be universally applied to an electronic system, and is obtainable from numerous vendors in the memory technology sector. Card 10 is therefore a memory card, and utilizes edge connectors 12 that can be frictionally engaged with conductive elements 28 arranged within receptor 22. Connectors 12 are designed to be releasibly inserted into receptor 22.

Shown in FIG. 2 is card 10 illustrated in partial breakaway. Card 10 is shown having one or more integrated circuits 30 connected to each other and to edge conductors 12 by trace conductors 32. A memory card preferably uses some form of memory array. A popular memory array involves an array of non-volatile storage elements. The non-volatile storage elements are preferably configured on a single monolithic silicon substrate, to form a non-volatile memory integrated circuit 30b. Along with circuit 30b is a memory controller 30a. In addition to integrated circuits 30, card 10 may also have mounted thereon discrete devices, such as decoupling or de-bounce capacitors 34. Capacitors 34 serve to minimize transient noise imputed onto trace conductors 32.

In addition to the printed circuit board (or card) on which memory 30b, memory controller 30a, and capacitors 34 are secured, card 10 can also take on a covering 36 which surrounds and protects the integrated circuits and capacitors mounted to card 10. Formed as part of covering 36 is a tab or switch 38 that, when moved, prevents a write operation to the memory integrated circuit. Switch 38 thereby suffices to "write protect" memory card 10. Any signals sent to edge conductors 12 intended to be written onto the storage elements of memory 30b will be prevented from being stored therein if switch 38 is activated. Activation can occur simply by moving switch 38 from one position to another along the sidewall surface of card 10.

The memory card 10 shown in the configuration of FIGS. 1 and 2 gained popularity, for example, during the advent of flash memory. Flash memory can be easily erased and reprogrammed. Once reprogrammed, the data within the flash memory is said to be non-volatile and remains until erased or again reprogrammed. Thus, card 10 can be erased and reprogrammed while in receptor 22 provided, of course, that switch 38 is not in the write protect position. Once programmed, any data stored within non-volatile memory 30b of card 10 will remain, thereby allowing card 10 to be removed and reinserted at a later time whenever that data is needed—similar to a floppy disk.

At present there are numerous types of memory cards having the aforesaid characteristics. Popular such memory cards include: Sony's memory stick, compact flash, smart media, PC cards, flash path, multimedia cards and secure digital. All of the well-known memory cards typically have both a memory controller and non-volatile memory mounted on the card itself, or have the controller form a part of the memory interface, all of which are interconnected to the edge connectors. In order to be usable in multiple electronic systems made by different manufacturers, the industry has imposed a standard on the size of many memory cards. For example, Personal Computer Memory Card International Association (PCMCIA) or Japanese Electronic Industry Development Association (JEIDA) implemented a standard dimension for what are dubbed as Type I, Type II or Type III cards. A Type I memory card measures approximately 2.126×3.37 inches, and is approximately 3.3 mm thick. A Type II memory card is approximately 5.0 mm thick, yet has the same length and width measurements as the Type I card. Under development is a further standard, known as Type III memory card, which is slated to be approximately 10.5 mm thick. All such types of cards are approximately 3.3 mm thick along their guide rails so thinner cards can fit newer, thicker slots. The Type I, Type II, and Type III memory cards are oftentimes referred to as PC cards since the memory cards are sometimes used as a slide-in memory for a personal computer. In addition, multimedia memory cards and secure digital memory cards are often dimensioned 32 mm×24 mm, with a thickness of 1.4 mm or 2.1 mm, respectively. A smart media card is, however, made approximately 45 mm×37 mm, with a thickness of about 0.70–0.88 mm.

Regardless of whether the memory card is dimensioned according to PCMCIA or JEIDA standards, or is dimensioned as a multimedia card, a secure digital card, a compact flash card, a smart media card or a flash path card, the memory card is one that must fit in a receptor specifically designed to receive a memory card manufactured by one of numerous manufacturers. Additionally, the memory card is considerably larger than a conventional packaged integrated circuit, which generally has no defined outer dimension since a packaged integrated circuit does not bear edge connectors placed only at one edge of the integrated circuit package for slide engagement into a receptor of an electronic system. Such systems include digital cameras, laptop computers, handheld PDAs that often have a slot to receive additional memory afforded by the memory card. The secure digital memory card can have a mechanical switch mounted on the outer covering to prevent writing of data to the integrated circuit. Various other memory cards may or may not have such a switch.

It would be desirable to be able to manufacture a memory card using a conventional edge connector arrangement employed by memory cards, and dimensioned according to standards used by legacy memory card manufacturers. The desired memory card would, however, avoid using a printed circuit board or card for electrical routing or as a backbone for mechanical stability. The desired memory card could be classified as a memory module made of less expensive materials and in less time than conventional memory cards. The desired memory module avoids the most expensive component of a memory card by eliminating the cost and lead time needed to form package material about an integrated circuit, form printed conductors upon and within a card, and form the connection between leads of the integrated circuit and printed conductors upon (or within) the card.

SUMMARY OF THE INVENTION

The problems outlined above are in large part solved by a memory module having the dimensions and characteristics of a conventional memory card absent the expense and time in making such a card. The memory module is dimensioned the same as conventional memory cards and functions similar to conventional memory cards, yet can be readily manufactured using essentially a two-step process: mount an un-packaged integrated circuit onto printed conductors absent a mechanical support of a card, and then encase the leads in a material configured according to a conventional memory card standard dimensions.

The memory module uses an integrated circuit that embodies the memory circuits, the memory controller, and any capacitive elements needed to decouple signal lines on a single monolithic substrate. The first step in processing the memory module entails bonding conductors to bonding pads of the integrated circuit similar to techniques used to bond leads to the integrated circuit when forming a packaged integrated circuit. However, instead of merely packaging the integrated circuit, the bonded conductors can then be encased within an encapsulate that has an outside dimension similar to conventional memory cards. The edge connectors attributable to a memory card are arranged in similar fashion on the memory module, where the conductors serve not only to connect to the integrated circuit bonding pads, but also a portion of each conductor is presented as a substantially planar surface (i.e., pad) that forms the corresponding edge connector.

According to one embodiment, a plurality of conductors form the edge connectors and receptors for coupling to corresponding bondings pads. The conductors therefore are used to connect electrical signals sent to and from the bonding pads via the edge connectors. Thus, a first end of each of the plurality of conductors are connected to corresponding bonding pads, and a second end of each of conductor is shaped similar to edge connectors of a conventional memory card. Unlike conventional integrated circuit packaging, the present plurality of conductors extend only in one direction from the integrated circuit, thereby, forming a row of second ends near an edge of the memory module. The second ends of the plurality of conductors extend flush with, or possibly extend slightly above or below, the outer surface of the memory module so that, when inserted into a receptor, the second ends which comprise the edge connectors, will be retained only in surface contact with a corresponding planar conductive surfaces within the receptor. The second ends therefore have a planar outer surface that releasibly contacts with a corresponding planar outer surface of conductive elements within the receptors so that the memory module can be slid into and be removed (i.e., released) from the receptor. Meanwhile, the second ends maintain electrical communication with the conductive elements so that the memory module communicates with the electronic system.

The plurality of conductors can be fingers extending into an opening created within a conductive tape or lead frame.

The fingers therefore form a part of the tape or the lead frame used in TAB or wire bond processes, respectively. Thus, the first end of one or more of the plurality of conductors can be secured directly to a corresponding bonding pad using, for example, solder bumps placed on the distal end of the TAB fingers. Alternatively, a wire can be imposed between the lead frame post, or "bond finger," and a bonding pad on the integrated circuit.

If a lead frame is used, the post that is coupled to the bonding pad by a wire bond is specially designed. The post (or conductor) can extend, for example, in two planes whereby a first plane can be above or coplanar with a first portion (or paddle) on which the integrated circuit is secured. A second part of the conductor can be configured parallel to the first plane, and below the first plane such that the post (or conductor) extends along the first plane downward at an angle to the second plane. According to one example, the downward angle is less than ninety degrees, and preferably less than 60 degrees from a horizontal plane. The second part, as well as the angled joinder of the first and second parts is encompassed entirely within the resin. The part of the conductor which occupies the second plane forms the edge connector and, therefore, is brought flush with the outer surface of the memory module. The part that extends along the first plane is dimensioned to receive a wire bond. In this fashion, the conductor or lead frame suffices not only to convey signals to and from the integrated circuit, but also is shaped to extend both within the memory module encapsulate material and outside the encapsulate material.

The memory module can be formed using a simple pair of mold housings, and the integrated circuit purposely avoids having to rest upon any mechanical support other than, for example, a first portion (or "paddle") of a lead frame. The pair of mold housings will thereby form a cavity which surrounds the TAB-bonded or lead frame-bonded integrated circuit, and liquid resin can be inserted into the cavity. The inner walls of the pair of mold housings which form the cavity are dimensioned as a memory card device with associated width, height, and length configuration of a convention memory card. Thus, the mold cavity is much larger than the silicon substrate of an un-packaged integrated circuit, wherein the mold cavity forms the memory module using flowable encapsulate surrounding solely a lead frame and attached integrated circuit. No intervening card or substrate is needed to support the integrated circuit as in conventional designs where packaged integrated circuits are mounted on a card, or flip-chip secured to a substrate that may be mounted to a card.

BRIEF DESCRIPTION OF THE DRAWINGS

Other objects and advantages of the invention will become apparent upon reading the following detailed description and upon reference to the accompanying drawings in which:

FIG. 3 is a perspective view of a conductive tape containing an opening into which fingers extend in registry above bonding pads of an integrated circuit;

FIG. 4 is a detailed block diagram of an integrated circuit;

FIG. 5 is a cross-sectional view along plane 5 of FIG. 4 after the fingers are bonded to the bonding pads and a pair of mold housings are configured around the suspended integrated circuit such that resin is flowed into the space between the mold housings and the integrated circuit;

Figure 1:
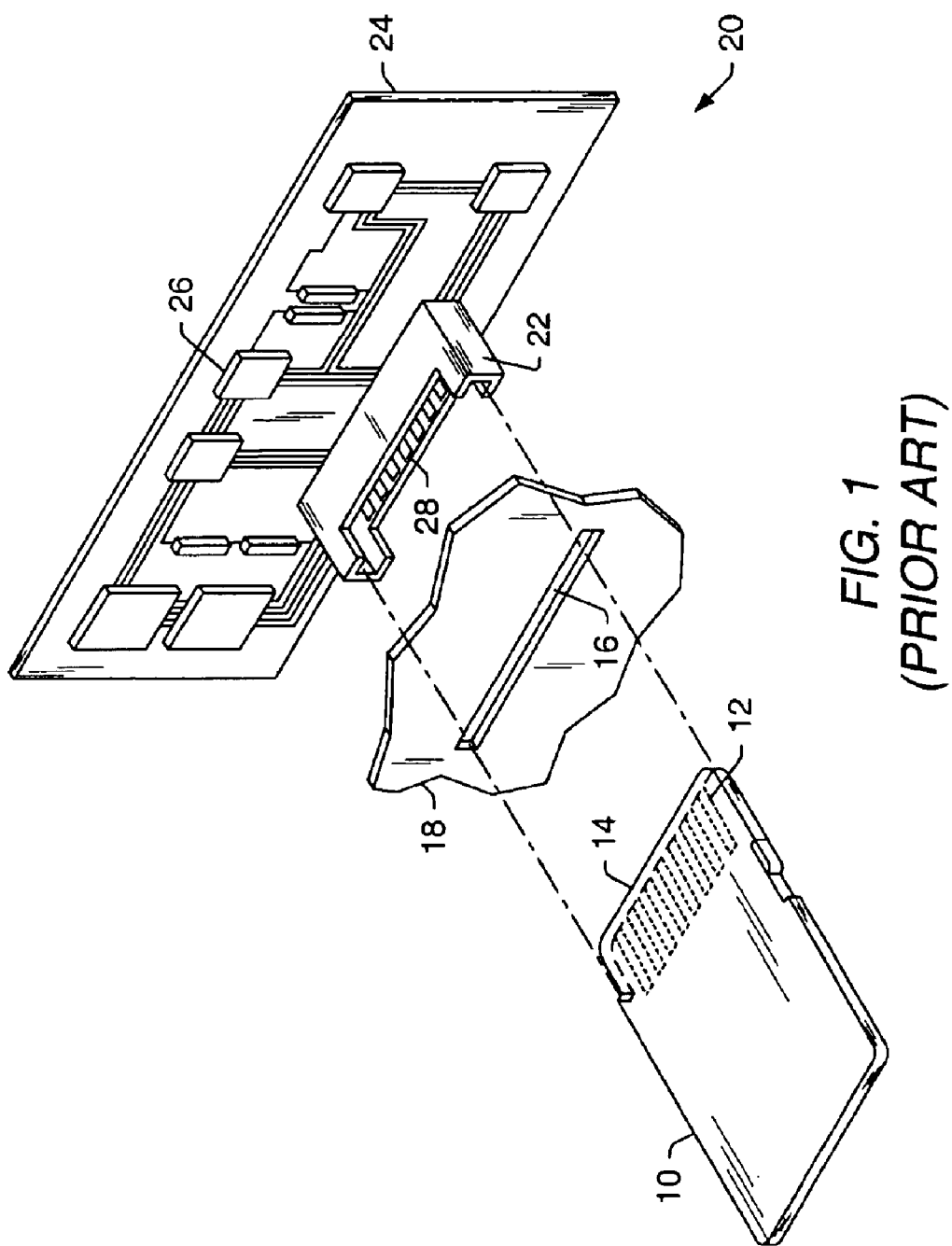
FIG. 1 is a perspective view of a memory card having one edge with edge connectors adapted for insertion through a slot of an electronic system and into a receptor, according to one memory card attachment methodology.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 3 illustrates one example of which bonding pads 40 of integrated circuit 42 are connected to fingers 44 extending from a laminated tape 46. Tape 46 can be arranged around a spool (not shown), and drawn from that spool to a position above corresponding integrated circuits. For example, tape 46 can be made of tin-plated copper tape using either an additive or subtractive process. Tape 46 can be made of a single layer, such as copper, aluminum, or a combination alloy of each. The tape can alternatively be made of multiple layers, where the electrically conductive layer is bonded to, for example, a polymide dielectric film. Additional layers can also be applied, such as chromium that promotes adhesion between the polymide and copper. The tape can also contain bumps. At the distal end of fingers 44 may be a downward (or upward) extending protrusion, or bump. For example, the bumps can be formed by plating gold over the conductive layer. Alternatively, the integrated circuit can be "bumped." A bumped integrated circuit is one having solder material "screened" on the bonding pads 40. Alternatively, gold can be placed on bonding pads 40 extending upward in registry with the distal end of fingers 44. In either situation, the bumps effectuate solder contact and a highly reliable electrical connection when pressure and heat is applied to tape 46 upon the upper surface of integrated circuit 42. The process of aligning coplanar fingers within a tape over corresponding bonding pads of integrated circuits and applying heat and pressure to wave solder the fingers to pads can be automated, and is generally regarded as Tape Automated Bonding (TAB).

In addition to heat and pressure, other mechanisms may also be used to form the connection in a TAB process. For example, adhesives or carbon-filled silicon rubber may be used between the fingers and bonding pads. This can minimize fatigue on the tape caused by heat and pressure. In addition, the bumps can be made either of a solder-based material or tin-lead composite. Alternatively, the bumps can be made mostly of gold which has a much higher conductivity than aluminum, tin, or lead. All of the various improvements for making tape 46, fingers 44, bumps on fingers 44 or pads 40, and securing fingers to corresponding pads are herein contemplated, provided such improvements effectuate a highly reliable and highly conductive connection between the conductive fingers 44 and circuits within integrated circuit 42.

FIG. 4 indicates the various components that can be found on a single integrated circuit. More specifically, the integrated circuit is a single dice within multiple dies arranged across a semiconductor wafer. The integrated circuit 42 represents the culmination of multiple processes applied to a single crystalline silicon base material. Those processes include implant, deposition, etch, clean, and polish steps, among others. Integrated circuit 42 is, however, not placed in a package after it is scribe-removed from the wafer. According to one example, integrated circuit 42 is highly integrated as having the various circuits needed to store data and recall data. Those circuits include an array of memory cells which, according to one example, can be based on non-volatile memory cells 50. The mechanism in which to direct data to the memory cells and to retrieve data from the memory cells involves a memory controller 52. Whatever data is sent to and from the memory cells must be kept substantially free of noise. Therefore, decoupling capacitors 54 may be used to maintain a more pristine characteristic of the data sent to and from the storage cells 50. Conductors which bear data and control signals extend to bonding pads, and are noted as conductors 56. Conductors 56 terminate at the bonding pads 40.

It may be necessary to have certain active bonding pads arranged on one side of each integrated circuit. Preferably, arranged on the opposing side of the integrated circuit could be dummy bonding pads which have bond capability, yet are not connected to any internal circuitry of the integrated circuit. For example, only one side of an integrated circuit can have active bonding pads, and the other three sides of the integrated circuit can have dummy bonding pads. The dummy bonding pads are necessary only for mechanical and assembly reasons, yet do not serve to communicate with internal circuitry of the integrated circuit.

As shown in FIG. 5, a cross-sectional view along plane 5 of FIG. 3 indicates that an active bonding pad 40*a* is placed near one side of integrated circuit 42, and a dummy bonding pad 40*b* is placed on the opposed side. Only the active bonding pad 40*a* is connected to internal circuitry of integrated circuit 42. Active bonding pad 40*a* serves as a connection point to the fingers of the metal foil or metal-laminated tape. The fingers which connect to active bonding pad 40*a* are noted as conductors 60*a*. There are multiple conductors extending in a single direction, as shown in FIG. 3. However, in the cross-section view of FIG. 5, only one conductor is shown. Similar to conductors 60*a*, there are other conductors 60*b* that connect to dummy bonding pads 40*b*. In this fashion, conductors 60*b* serves merely to support integrated circuit 42 within a cavity formed by a pair of mold housings 62*a* and 62*b*. The mold housings 62 clamp toward one another and on opposite sides of conductors 60 that had been previously coupled to integrated circuit 42. Accordingly, integrated circuit 42 is suspended within the cavity between the inner surfaces of mold housings 62, yet only conductors 60*a* will eventually extend to the edge connectors of the ensuing memory module.

FIG. 5 indicates that after the conductors 60 of the tape are secured and electrically connected to corresponding bonding pads on integrated circuit 42, the conductors are retained between a pair of mold housings 62, and liquid resin 66 is injected into the air-filled space surrounding integrated circuit 42. Contrary to ceramic packaging techniques which leave an air-filled space between the integrated circuit and the package inner surface, the present technique purposely fills that space with an encapsulate that also suffices as the memory module encasement. Thus, the resin itself extends outward from the integrated circuit to an outer surface after the pair of mold housings 62 are removed.

The resin can be made of any inert component that is non-conductive, yet may have some thermal conductive properties. For example, the resin can be made of silicones, phenolics, and bisphenol (epoxy). The resin can also contain various curing agents, hardeners, accelerators, inert fillers, coupling agents, flame-retardants, stress-relief additives, coloring agents, and mold-release agents. In whatever form, resin 66 is injected in liquid form into the cavity between the inward-facing surfaces of mold housings 62. After the liquid resin has had sufficient time to cure, it hardens to the form and dimension of a conventional memory card.

Figure 6:
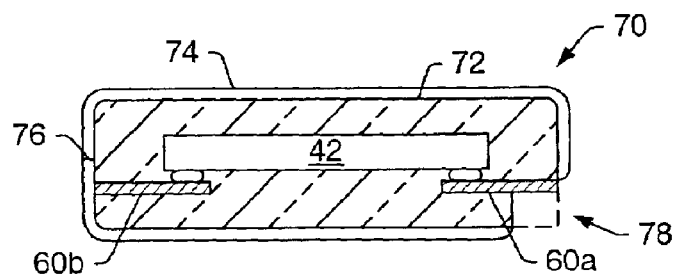
FIG. 6 is cross-sectional view along plane 5 of FIG. 4 after a covering is placed around the ensuing memory module and a portion of hardened resin is removed to expose the conductive fingers arranged in a row along the backside of the memory module.

FIG. 6 illustrates memory module 70 made of hardened resin material 72 which encompasses integrated circuit 42 and conductors 60. The hardened resin serves to protect the integrated circuit 42 from ingress of moisture, and provides a mechanical support for integrated circuit 42.

Figure 2:
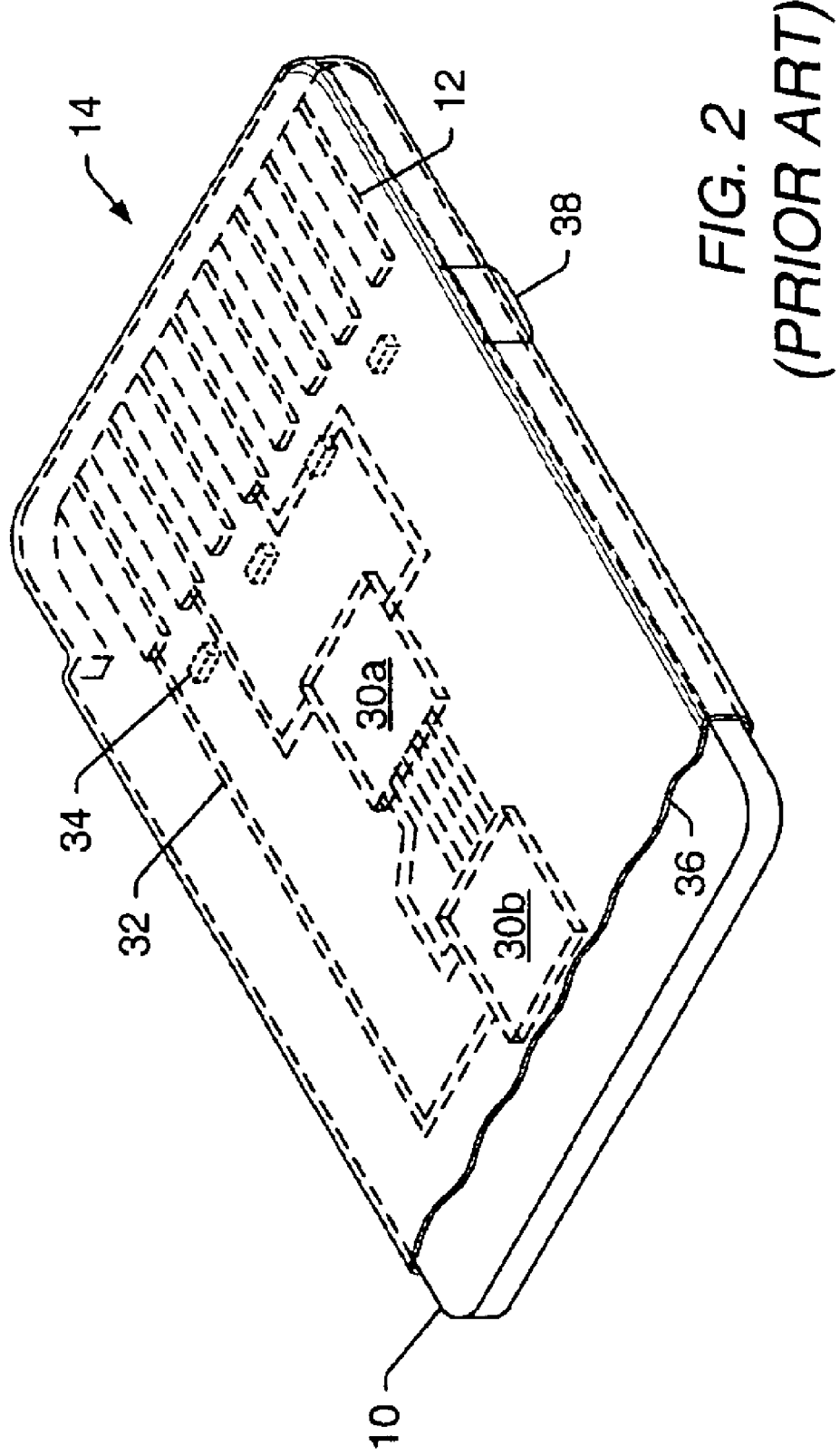
FIG. 2 is a perspective view of the memory card with packaged integrated circuits mounted upon a rigid printed circuit board and shrouded within a covering.

After resin 72 has hardened, a covering 74 can be placed around the hardened resin. For example, covering 74 can be made of plastic which is heat-shrunk to fit the outer dimensions of the resin, or can be glued or welded at the joint between a two-part assembly of the covering. Memory card 70 may, therefore, be formed either with or without covering 74. If covering 74 is present, however, a mechanical switch or tab can be formed within the covering, similar to item 38 shown in FIG. 2. Alternatively, the switch can be snap assembled to slots formed in the resin 72.

Regardless of whether covering 74 is used, the hardened resin can be partially removed to expose an outer surface of conductor 60*a*. Removal 78 can take place either by backlapping or etching the molded resin in the select region near the edge of memory module 70. Beneficially, the removal process is employed on the backside surface of the memory module near the forward-leading edge, so that the forward edge can be inserted into a receptor bearing corresponding conductive elements. Alternatively, the molding process can leave the pad areas free of resin by, for example, forming the mold cavity so that a recess can be formed to expose the conductors 60*a*.

Figure 7:
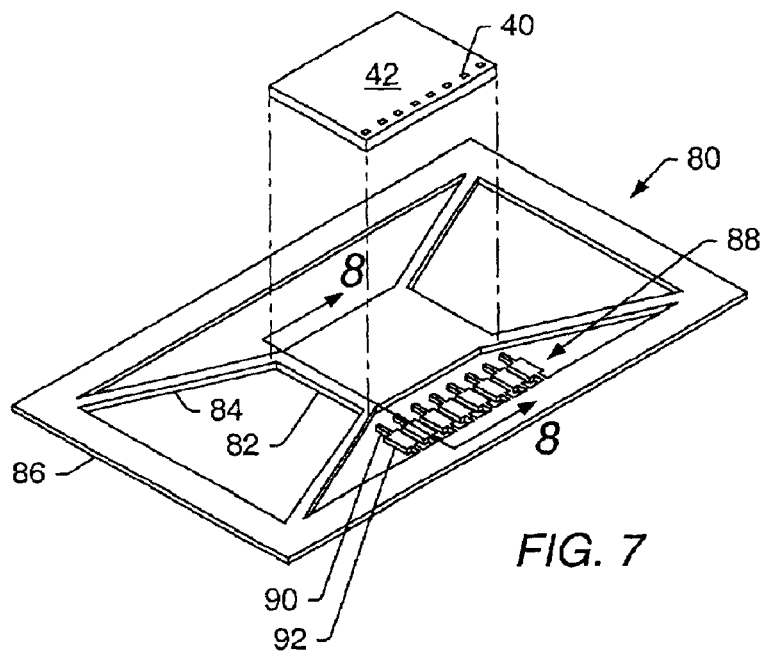
FIG. 7 is a perspective view of a lead frame having first and second portions co-planar to each other, where the first portion is adapted to receive an integated circuit, and the second portion forms one or more conductors spaced laterally from the first portion for receiving a wire bond.

FIG. 7 illustrates an alternative technique for mounting conductors to an integrated circuit. Instead of using a TAB mechanism, FIG. 7 illustrates a lead frame 80. Lead frame 80 contains a first portion (paddle) 82 that will secure integrated circuit 42 without having to bond the integrated circuit to inoperative (dummy) bonding pads. Lead frame 80 serves to support the molded memory module, and is fabricated from a strip of sheet metal by stamping or chemical milling. Lead frame 80 provides a holding fixture during the assembly process in which bonding pads 40 of integrated circuit 42 are connected to the lead frame. Then after molding, lead frame 80 becomes an integral part of the memory module. The lead frame can be made of numerous materials, such as nickel-iron or copper alloy. Similar to a tape, the lead frame can also be layered as a composite strip, such as a copper alloy placed upon a stainless steel structure.

Extending outward from the first portion 82 of lead frame 80 are support arms 84. Support arms 84 thereby secure the position of the first portion 82 relative to a frame 86 which encircles first portion 82. Extending inward from one side of frame 86 is a series of conductors 88. Each conductor 88 includes a first portion 90 and a second portion 92. First portion 90 is relatively thin in upper surface area, while second portion 92 is much wider. Portions 90 and 92 are formed from a single piece of conductive material and extend as an integral piece with items 82, 84 and 86. Thus, support member 84, first portion 82, member 86, and conductors 88 are preferably formed from the same sheet, with each item stamped from that sheet.

Figure 8:
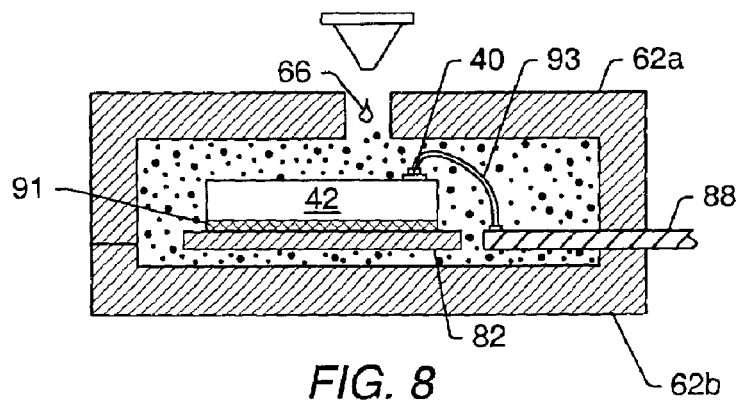
FIG. 8 is a cross-sectional view along plane 8 of FIG. 7 after one or more conductors are wire bonded to the bonding pads and a pair of mold housings are configured around the suspended integrated circuit such that resin is flowed into the space between the mold housings and the integrated circuit.

FIG. 8 illustrates a cross-sectional view along plane 8 of FIG. 7 after integrated circuit 42 is bonded to first portion 82. For example, the integrated circuit can be bonded using a die adhesive, such as silicon/gold eutectic bonding or by use of a polymer adhesive base. Die adhesive 91 includes any structure that securely fastens integrated circuit 42 to first portion 82. After integrated circuit 42 is secured, a wire 93 can be ultrasonically or thermosonically welded to one or more conductors 88 and one or more bonding pads 40 upon integrated circuit 42. After integrated circuit 42 is attached and conductor 88 is electrically connected to a corresponding bonding pad 40, a pair of mold housings 62 are secured about integrated circuit 42 and a liquid resin 66 is injected into the mold cavity.

Figure 9:
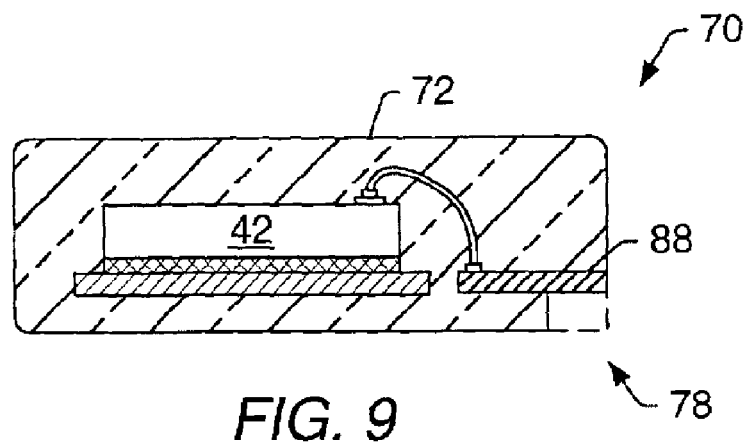
FIG. 9 is a cross-sectional view along plane 8 of FIG. 7 after and a portion of hardened resin is removed to expose the conductors arranged in a row along the backside of the memory module.

FIG. 9 illustrates memory module 70 after removal of the pair of mold housings and the back-lapping or etching of the hardened resin to expose conductor 88 as the edge connector. The removal process 78 can be the same as that shown in FIG. 6. Alternatively, the molding process can itself leave the edge connectors exposed. The hardened resin 72 may or may or not be encircled by a covering and, as shown in FIG. 9, no covering need be present.

Figure 10:
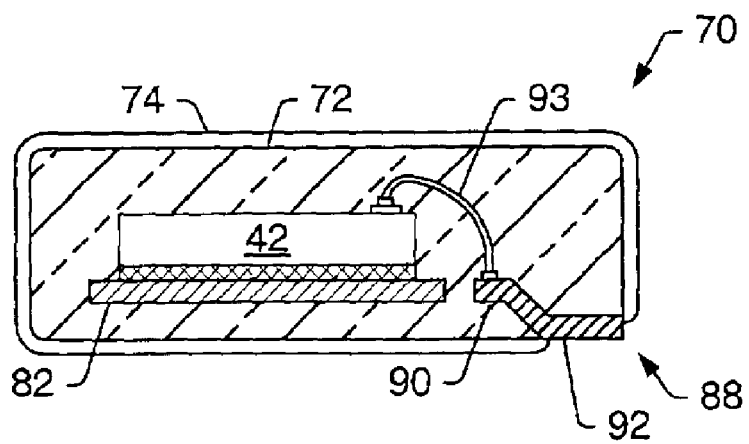
FIG. 10 is a cross-sectional view along plane 8 of FIG. 7 according to an alternative arrangement whereby at least one of the conductors is bent downward to form a conductive surface that is flush with or extends beyond an outer surface of the memory module to avoid backlapping the module.

FIG. 10, however, illustrates use of a covering 74 and, more importantly, depicts a bend placed in conductor 88 of the lead frame. Conductor 88 is thereby shown with a first part 90 that receives a wire bond of wire 93. First part 90 is substantially coplanar with the first portion 82 of the lead frame. Conductor 88, therefore, extends along a first plane substantially coplanar to the first portion 82, downward at an angle to a second plane at which the second part 92 resides. Second part 92 has an outer surface which extends flush with the outer surface of the hardened resin 72. As such, second part 92 is exposed at the forward-leading edge of memory module 70. By employing a bend within conductor 88, no back-lapping or etching need take place on the hardened resin material 72 in order to expose an edge of conductor 88. Additionally, the second part 92 consists of a widened surface (see FIG. 7) that will accommodate conductive elements within, for example, receptors. By bending one or more conductors 88 within a row of conductors, the exposed part 92 of each conductor will form substantially a row of edge connectors at the forward-leading edge of memory module 70. The edge connectors can be slightly offset from each other along a single axis. Even though one or more edge connectors within a row may be offset from the axis, the edge connectors nonetheless maintain somewhat of an alignment along a line relative to one another. Thus, offset edge connectors can still deemed ones arranged in a row. First portion 82 and integrated circuit 42, however, remain suspended entirely within the hardened resin 72. Little if any moisture can, therefore, contact portion 82 or integrated circuit 42.

Figure 11:
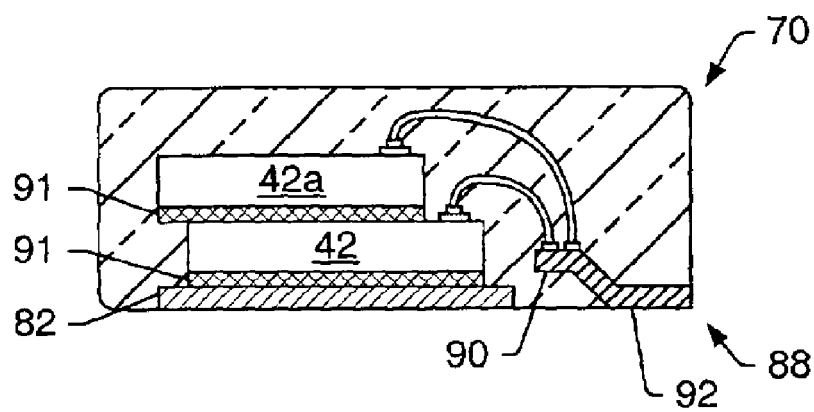
FIG. 11 is a cross-sectional view along plane 8 of FIG. 7 according to an alternative arrangement whereby two or more stacked integrated circuits are bonded to at least one of the conductors that is is bent downward to form a surface of the first and second portions of the lead frame flush or extending beyond an outer surface of the memory module to form a thermally enhanced memory module arrangement.

FIG. 11 illustrates an alternative arrangement, where first part 90 of conductor 88 can be arranged in a plane above first portion 82. Unlike the arrangement in FIG. 10 where first part 90 is coplanar with first portion 82, the first part 90 of FIG. 11 is above the plane formed by first portion 82, and second part 92 is coplanar with first portion 82. FIG. 11, therefore, illustrates elevating conductor 88 above first portion 82 to serve not only to expose second part 92 as an edge connector, but also to expose the backside surface of first portion 82. Recall that portion 82 is a conductive element, and that die adhesive 91 may be thermally conductive. This allows any heat build-up within integrated circuit 42 to be transferred downward to the thermally conductive elements 91 and 82. As such, the thermally conductive portion 82 will operate as a heat sink to remove heat away from integrated circuit 42.

It may be desirable that memory module 70 use two or more integrated circuits. For example, one integrated circuit may simply contain the memory storage element, and another integrated circuit be used to contain the memory controller and any decoupling capacitors needed. Alternatively, the first integrated circuit can contain storage elements and a controller, while the second integrated circuit can also contain storage elements and a controller, similar to the first integrated circuit. If, for example, a single integrated circuit does not contain all of the storage elements, controller, and decoupling components, memory module 70 can accommodate one integrated circuit stacked upon another using a die adhesive 91 placed therebetween. The second integrated circuit 42a can be shifted or offset laterally from integrated circuit 42. Alternatively, the second integrated circuit need not be offset if, for example, the second integrated circuit is spaced from the integrated circuit by a spacer that can accommodate wires coupled to the underlying bonding pads. In either instance, measures need be taken to enable a row of bonding pads on the lower integrated circuit to be exposed if, for example, wire bonding is needed. Since only those bonding pads arranged near one side of an integrated circuit are bonded, the second integrated circuit can be placed over the lower integrated circuit possibly offset according to the configuration shown. Wire bonds can emanate from bonding pads of both the upper and lower integrated circuits to corresponding first part 90 of respective conductors 88.

It will be appreciated to those skilled in the art having the benefit of this disclosure that the details provided herein are believed to denote a memory module that can be formed without having to first package an integrated circuit, and then bond leads of the packaged integrated circuit to a printed circuit board or card. The memory module thereby avoids using cards as the backbone of mechanical support and electrical connectivity normally employed in conventional memory cards. The improved memory module can have further modifications and alternative forms to include various aspects of the present invention, as will be apparent to those skilled in art after having reviewed this description. It is intended that the following claims be interpreted to embrace all such modifications and changes and, accordingly, the specification and drawings are to be regarded in an illustrative rather than a restrictive sense.

What is claimed is:

1. A memory module, comprising:
 a plurality of conductors, each of which have opposed first and second ends;
 a stacked pair of integrated circuits connected directly to the first end of each of the plurality of conductors; and
 a molded resin encasing the stacked integrated circuits and having a first outer planar surface along which a lateral surface of the plurality of conductors partially extends to the respective second ends so that all conductors terminate in a single row substantially flush with a second outer planar surface approximately perpendicular to the first outer surface.

2. The memory module as recited in claim 1, wherein an edge of the memory module is adapted for slideable engagement into a receptor that is electrically connected to an electronic system.

3. The memory module as recited in claim 2, wherein the second end of each of the plurality of conductors are adapted for frictional engagement with, and electrical connection to, conductive elements arranged within the receptors, during times when the edge of the memory module is slid into the receptor.

4. The memory module as recited in claim 1, wherein the molded resin extends at least partially around the stacked integrated circuits to form an entire outer dimension of the memory module.

5. The memory module as recited in claim 4, wherein the entire outer dimension of the memory module is of equivalent size to a memory card.

6. The memory module as recited in claim 4, wherein the memory module is mechanically and electrically interchangeable with a memory card.

7. The memory module as recited in claim 4, wherein the entire outer dimension of the memory module except for the second end of each of the plurality of conductors is surrounded by a covering that employs a mechanical tab which, when actuated, prevents writing data to the integrated circuit.

8. The memory module as recited in claim 4, wherein a surface of the stacked integrated circuits is bonded to a surface of a conductive plate, the opposite surface of the conductive plate extends flush with or beyond the outer dimension of the memory module.

9. The memory module as recited in claim 8, wherein the plate is thermally conductive.

10. The memory module as recited in claim 1, wherein the stacked integrated circuits comprises memory and a memory controller embodied upon a single monolithic silicon substrate.

11. The memory module as recited in claim 1, further comprising wires extending between a plurality of bonding pads on the stacked integrated circuits and the first end of each of the plurality of conductors.

12. The memory module as recited in claim 1, further comprising solder extending between a plurality of bonding pads on the stacked integrated circuits and the first end of each of the plurality of conductors.

13. The memory module as recited in claim 1, wherein the plurality of conductors comprise flattened metal strips attributed to lead frame or a tape mounted upon a Tape Automated Bonding (TAB) device.

14. A method for forming a memory module, comprising:
 coupling an integrated circuit to at least one of a plurality of conductors all conductors extending substantially parallel to each other and in a single direction laterally from the integrated circuit along two planes substantially parallel with a plane formed by the integrated circuit;
 securing the plurality of conductors between a pair of mold housings, each of which have a cavity that surrounds opposed surfaces of the integrated circuit absent any structure between the coupled integrated circuit and the pair of mold housings; and
 inserting resin between the pair of mold housings.

15. The method as recited in claim 14, wherein said coupling comprises ultrasonic or thermosonic bonding a wire between the integrated circuit and said at least one of the plurality of conductors.

16. The method as recited in claim 14, wherein said coupling comprises Tape Automated Bonding (TAB) said at least one of the plurality of conductors to at least one bonding pad upon the integrated circuit.

17. The method as recited in claim 14, wherein said coupling further comprises mounting another integrated circuit offset upon an upper surface of the integrated circuit to expose a set of bonding pads on the integrated circuit to the plurality of conductors.

18. The method as recited in claim 17, wherein said mounting further comprises coupling said another integrated circuit to at least one of the plurality of conductors.

19. The method as recited in claim 14, wherein said securing comprises suspending the integrated circuit within an air-filled space formed by the cavity of each of the mold housings by clamping the plurality of conductors between the pair of mold housings a spaced distance from the cavity.

20. The method as recited in claim 14, wherein said inserting resin comprises flowing the resin in liquid form into an air-filled space formed by the cavity of each of the mold housings and then allowing the resin to harden.

* * * * *

UNITED STATES PATENT AND TRADEMARK OFFICE
CERTIFICATE OF CORRECTION

PATENT NO. : 6,843,421 B2
DATED : January 18, 2005
INVENTOR(S) : Chhor et al.

It is certified that error appears in the above-identified patent and that said Letters Patent is hereby corrected as shown below:

<u>Title page,</u>
Item [74], *Attorney, Agent, or Firm*, please delete "Kevin J. Daffer" and substitute therefor -- Kevin L. Daffer --.

Signed and Sealed this

Twenty-third Day of August, 2005

JON W. DUDAS
*Director of the United States Patent and Trademark Office*